(12) United States Patent
Miya et al.

(10) Patent No.: US 7,994,804 B2
(45) Date of Patent: Aug. 9, 2011

(54) ELECTRONIC COMPONENT TESTER

(75) Inventors: Takanori Miya, Osaka (JP); Isao Hayami, Hyogo (JP); Shoichi Tanaka, Kyoto (JP)

(73) Assignee: Panasonic Corporation, Osaka (JP)

( * ) Notice: Subject to any disclaimer, the term of this patent is extended or adjusted under 35 U.S.C. 154(b) by 145 days.

(21) Appl. No.: 12/579,955

(22) Filed: Oct. 15, 2009

(65) Prior Publication Data

US 2010/0127712 A1  May 27, 2010

(30) Foreign Application Priority Data

Nov. 27, 2008 (JP) ................................ 2008-302369
Sep. 3, 2009 (JP) ................................ 2009-203632

(51) Int. Cl.
 *G01R 31/00* (2006.01)
 *G01R 31/26* (2006.01)
(52) U.S. Cl. .......... 324/750.03; 324/756.02; 324/762.01
(58) Field of Classification Search ............. 324/750.03, 324/756.02, 762.01
 See application file for complete search history.

(56) References Cited

U.S. PATENT DOCUMENTS

| 5,402,077 | A | * | 3/1995 | Agahdel et al. | 324/756.02 |
| 5,528,159 | A | * | 6/1996 | Charlton et al. | 324/750.25 |
| 5,742,168 | A | * | 4/1998 | Kiyokawa et al. | 324/750.13 |
| 5,786,704 | A | * | 7/1998 | Kim | 324/756.01 |
| 5,911,897 | A | * | 6/1999 | Hamilton | 219/497 |
| 5,923,179 | A | * | 7/1999 | Taylor | 324/750.1 |
| 5,990,692 | A | * | 11/1999 | Jeong et al. | 324/754.08 |
| 6,025,732 | A | * | 2/2000 | Foo et al. | 324/750.05 |
| 6,104,204 | A | * | 8/2000 | Hayama et al. | 324/750.08 |
| 6,213,806 | B1 | * | 4/2001 | Choy | 439/331 |
| 6,313,653 | B1 | | 11/2001 | Takahashi et al. | |
| 6,668,570 | B2 | * | 12/2003 | Wall et al. | 62/223 |
| 6,680,570 | B2 | * | 1/2004 | Roitman et al. | 313/506 |
| 6,809,543 | B1 | * | 10/2004 | Tustaniwskyj et al. | 324/750.09 |
| 7,230,830 | B2 | * | 6/2007 | Ujike et al. | 361/704 |
| 7,295,027 | B2 | * | 11/2007 | Matsuzawa | 324/750.03 |
| 2003/0014980 | A1 | | 1/2003 | Ono | |
| 2004/0070412 | A1 | | 4/2004 | Haseyama et al. | |
| 2006/0164111 | A1 | * | 7/2006 | Lopez et al. | 324/760 |
| 2006/0238188 | A1 | | 10/2006 | Naitou et al. | |

FOREIGN PATENT DOCUMENTS

JP  2005-121625  5/2005
JP  2007-078388  3/2007

* cited by examiner

*Primary Examiner* — Huy Phan
*Assistant Examiner* — Joshua Benitez
(74) *Attorney, Agent, or Firm* — McDermott Will & Emery LLP

(57) ABSTRACT

The electronic component tester includes: a socket configured to supply power to connection terminals for operating an electronic component; an electronic component mount member on which the electronic component is to be mounted; and a temperature adjusting member which is configured to come into contact with the electronic component mount member to keep the electronic component at a predetermined temperature. The electronic component mount member includes a heat transfer plate on which the electronic component is to be mounted and which is configured to come into contact with the temperature adjusting member, and an electronic component cover for covering the electronic component. The heat transfer plate includes through holes.

8 Claims, 6 Drawing Sheets

ELECTRONIC COMPONENT TESTER

CROSS-REFERENCE TO RELATED APPLICATIONS

This application claims priority to Japanese Patent Application No. 2009-203632 filed on Sep. 3, 2009 and Japanese Patent Application No. 2008-302369 filed on Nov. 27, 2008, the disclosure of each of which including the specification, the drawings, and the claims is hereby incorporated by reference in its entirety.

BACKGROUND

The present disclosure relates to electronic component testers configured to test electronic components.

Processes for fabricating electronic components such as semiconductor devices include, as a test, a burn-in test to measure the characteristics of the electronic components while the electronic components are operated in a high temperature environment. In the burn-in test, the quality characteristics of the electronic components are measured while the electronic components are operated in an environment in which temperature is higher than the normal temperature. For such a test, a dedicated burn-in apparatus is used (see Patent Documents 1 and 2). There are two temperature control systems for burn-in apparatuses; one is a system in which the temperature of electronic components is indirectly controlled by an atmospheric gas in a thermostat, and the other is a system in which a temperature adjusting part is directly brought into contact with electronic components to directly control the temperature of the electronic components.

Patent Document 1: Japanese Unexamined Patent Publication No. 2005-121625
Patent Document 2: Japanese Unexamined Patent Publication No. 2007-078388

SUMMARY

According to the technique described in Patent Document 1, CAN packages which are cylindrical containers each having an electronic component body stored therein are inserted into a dedicated socket in a thermostat, and semiconductor laser devices serving as electronic components are indirectly heated by an atmosphere heated to a predetermined temperature in the thermostat, thereby controlling temperature. Therefore, it takes approximately 30 to 60 minutes to raise the temperature of all the semiconductor laser devices in the thermostat to a predetermined test temperature, at which the semiconductor laser devices are stabilized.

Moreover, due to variations in ambient temperature in the thermostat, even if the occupancy of semiconductor laser devices to be stored with respect to the volume of the storage space of the thermostat is greater than or equal to 0.02% and less than 0.1% of the volume of the storage space, it is difficult to control the temperature of the plurality of semiconductor laser devices stored in the thermostat to be uniform. In particular, semiconductor laser devices whose heat generation rate is increasing heat the atmosphere in the thermostat by heat generated by the semiconductor laser devices themselves, thereby easily varying the temperature between a center section in which the semiconductor laser devices are densely disposed and a circumferential section in which the semiconductor laser devices are not densely disposed, so that it is difficult to control temperature with high precision.

There may be a semiconductor laser device including: a part sealing a light emitting element with an inert gas and having a cylindrical, three-dimensional structure like the CAN package; and three connection terminals led out in a vertical direction on a back surface opposite to a light emitting surface of the light emitting element, where the back surface and a temperature adjusting surface are the same surface. According to the technique described in Patent Document 2, it is not possible to directly heat such a semiconductor laser device by bringing a heat transferring part into contact with the surface opposite to the light emitting surface with the three connection terminals being inserted into a socket for establishing contact. Moreover, since the package has a cylindrical shape, and the light emitting element is surrounded by an inert gas, heating from side faces of a temperature adjusting part of the package cannot be controlled with quick response and high precision due to the fact that an area available for transferring heat to the light emitting element is small. That is, the form of electronic components which can be tested by the tester of Patent Document 2 is limited.

To solve the problems discussed above, an electronic component tester of the present disclosure includes: an electronic component mount member on which an electronic component having protruding connection terminals is to be mounted; a socket configured to allow a current to flow through the connection terminals of the electronic component; and a temperature adjusting member configured to keep the electronic component in a predetermined temperature environment, wherein the electronic component mount member includes a heat transfer plate having a first surface which is configured to come into contact with the electronic component, a second surface opposite to the first surface, and a third surface which is configured to come into contact with the temperature adjusting member, the heat transfer plate is configured to come into contact with the electronic component at the first surface, and the first surface includes through holes of a size permitting insertion of the connection terminals.

Alternatively, an electronic component tester is configured to test an electronic component having a semiconductor element stored in a container having a cylindrical shape and connection terminals protruding from a bottom surface of the container in a predetermined temperature environment, wherein the electronic component tester may include: a socket configured to supply power to the connection terminals for operating the electronic component; an electronic component mount member on which the electronic component is to be mounted and which is configured to be set in the socket; and a temperature adjusting member which is configured to come into contact with the electronic component mount member to keep the electronic component in the predetermined temperature environment, wherein the electronic component mount member has a heat transfer plate on which the electronic component is to be mounted and which is configured to come into contact with the temperature adjusting member, and an electronic component cover for covering the mounted electronic component for protection thereof, the heat transfer plate has through holes, the thickness of the heat transfer plate is set to a thickness allowing tips of the connection terminals to protrude from a second surface opposite to the first surface when the connection terminals are inserted through the first surface of the heat transfer plate into the through holes, and the bottom surface of the container of the electronic component comes into contact with the first surface, and the electronic component cover includes an elastic member to press the bottom surface of the container of the electronic component against the first surface.

DETAILED DESCRIPTION

Figure 8:
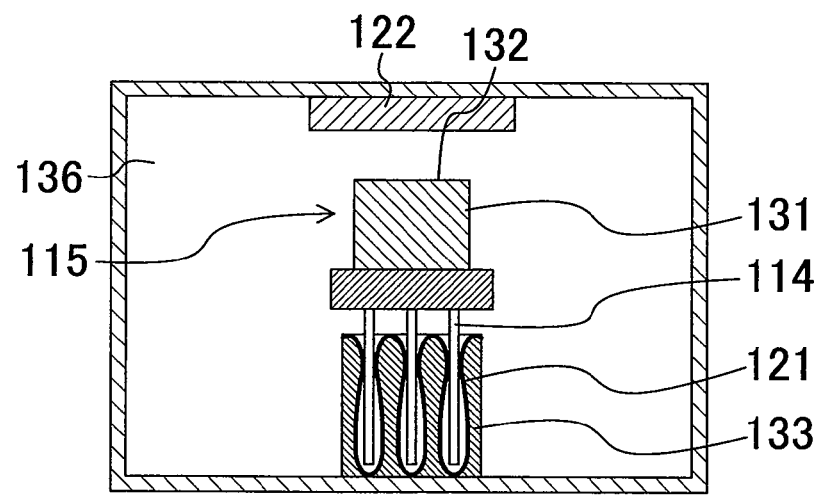
FIG. 8 is a view showing an electronic component tester to be compared with the electronic component tester of the present disclosure.

First, a technique to be compared with the technique of the present disclosure will be described with reference to FIG. 8, where the temperature of semiconductor laser devices serving as electronic components is indirectly controlled by using an atmospheric gas in a thermostat. FIG. 8 is a side view schematically showing the interior of a burn-in apparatus for semiconductor laser devices 115 in a CAN-package form. In the burn-in apparatus for CAN packages, three connection terminals 114 located on a surface of each semiconductor laser device 115 opposite to a light emitting surface 132 are inserted into a dedicated socket 133 in a thermostat, an atmospheric gas in a storage space 136 in the thermostat is kept at a predetermined temperature, and the semiconductor laser devices 115 are left to become stable at the predetermined temperature. In this state, the semiconductor laser devices 115 are operated to detect malfunctioning semiconductor laser devices 115.

Figure 9:
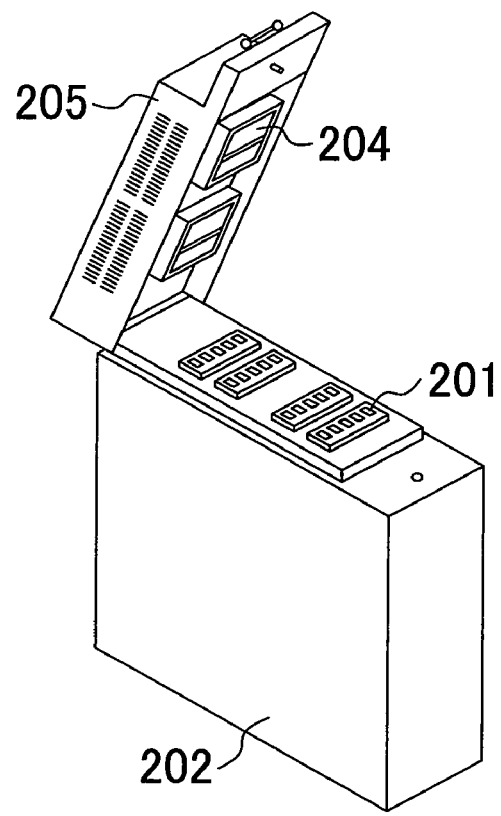
FIG. 9 is a perspective view showing another electronic component tester to be compared with the electronic component tester of the present disclosure.
Figure 10:
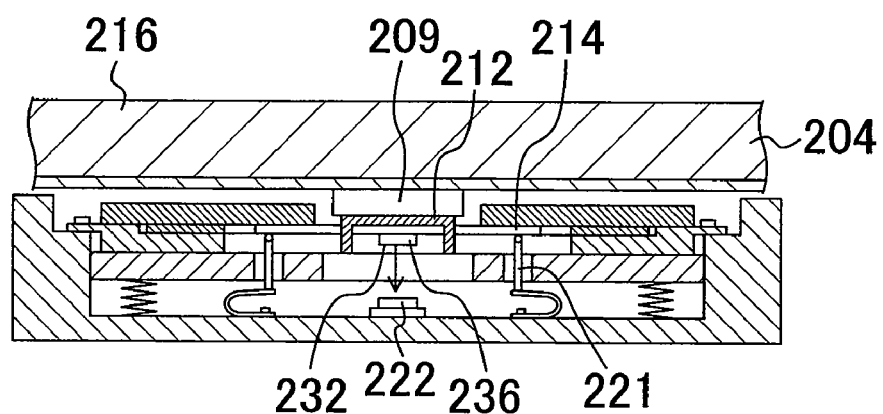
FIG. 10 is a detailed view showing yet another electronic component tester to be compared with the electronic component tester of the present disclosure.

Next, a technique to be compared with the technique of the present disclosure will be described with reference to FIGS. 9 and 10, where a contact-type temperature adjusting part is brought into contact with semiconductor laser devices serving as electronic components to directly control the temperature of the semiconductor laser devices. FIG. 9 is a perspective view schematically showing an electronic component tester with its upper cover 205 being open. As the electronic components which are to be tested, light emitting elements 236 are used. Each light emitting element 236 has a light emitting surface and connection terminals extending parallel to the light emitting surface. The electronic component tester includes a tester body 202 for carrying out a performance test on the light emitting elements 236, a socket 201 on which the light emitting elements 236 are to be mounted, a contact-type temperature adjusting part 204 which is directly or indirectly brought into contact with the light emitting elements 236, and the upper cover 205. Moreover, FIG. 10 shows a light emitting element 236 in a contact state, in which the light emitting element 236 is mounted on the socket 201, and is in contact with the contact-type temperature adjusting part 204 in the electronic component tester. In this electronic component tester, connection terminals 214 which extend on the same surface parallel to the light emitting surface 232 are brought into contact with contacts 221, and heat is transferred from a heat transfer block 216 serving as a heat source via a heat transfer bump 209 to a flat temperature adjusting surface 212 opposite to the light emitting surface 232 of the light emitting element 236, thereby controlling temperature. In this state, a light receiving element 222 receives light from the light emitting element 236 to test the light emitting element 236. In this apparatus, the heat transfer bump 209 serving as a heat source is brought into contact with the light emitting element 236, which makes it possible to shorten time required for temperature control to increase efficiency of the test, and to increase the precision of the temperature control to achieve high precision of the test. In particular, in a test in which the heat generation rate of the light emitting element 236 itself is increasing, this technique has excellent performance in terms of temperature control and is effective.

However, the inventors have found that the above-described techniques to be compared with the technique of the present disclosure include major problems similar to those discussed above. To solve the problems, the inventors of the present application made various studies, and as a result, arrived at the invention of the present application. Preferable embodiments will be described below.

Embodiment 1

Figure 1:
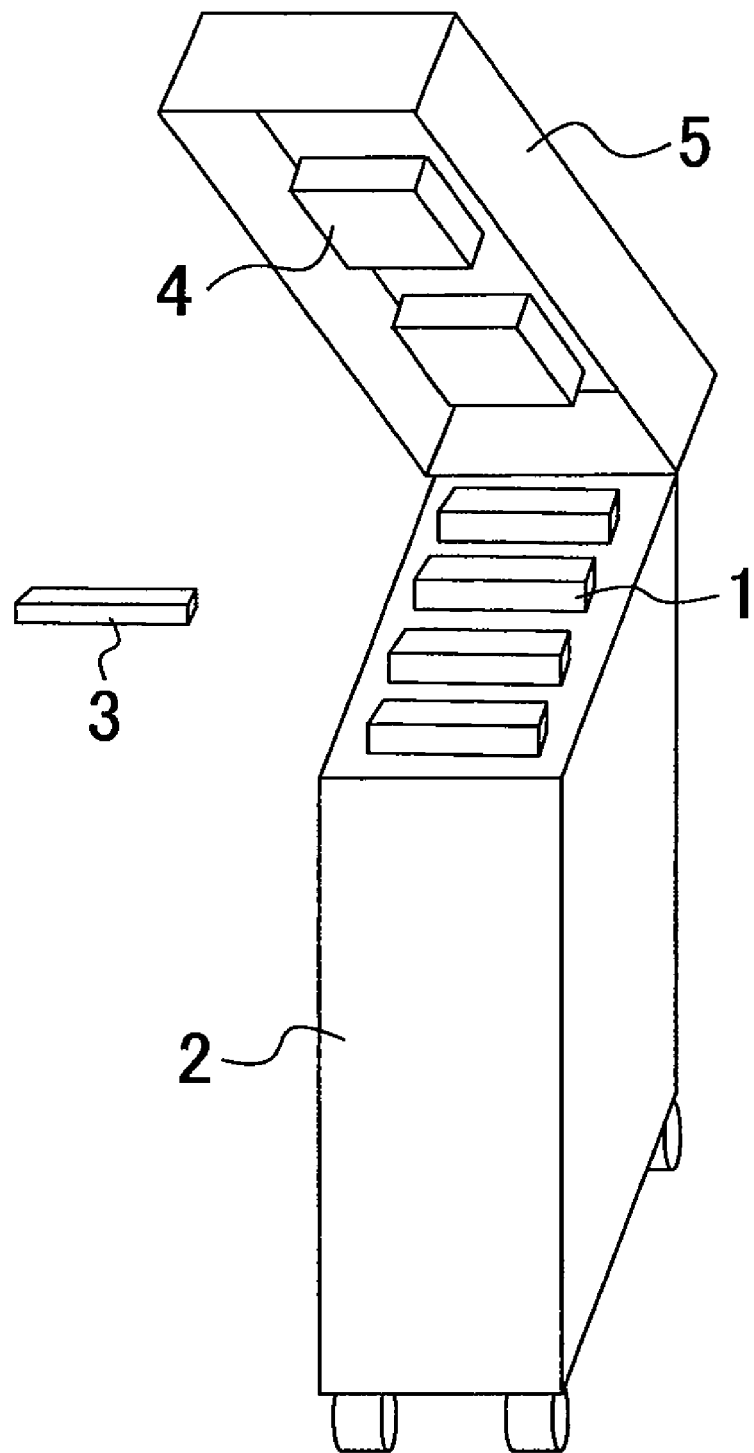
FIG. 1 is a perspective view showing an electronic component tester of an embodiment.
Figure 2:
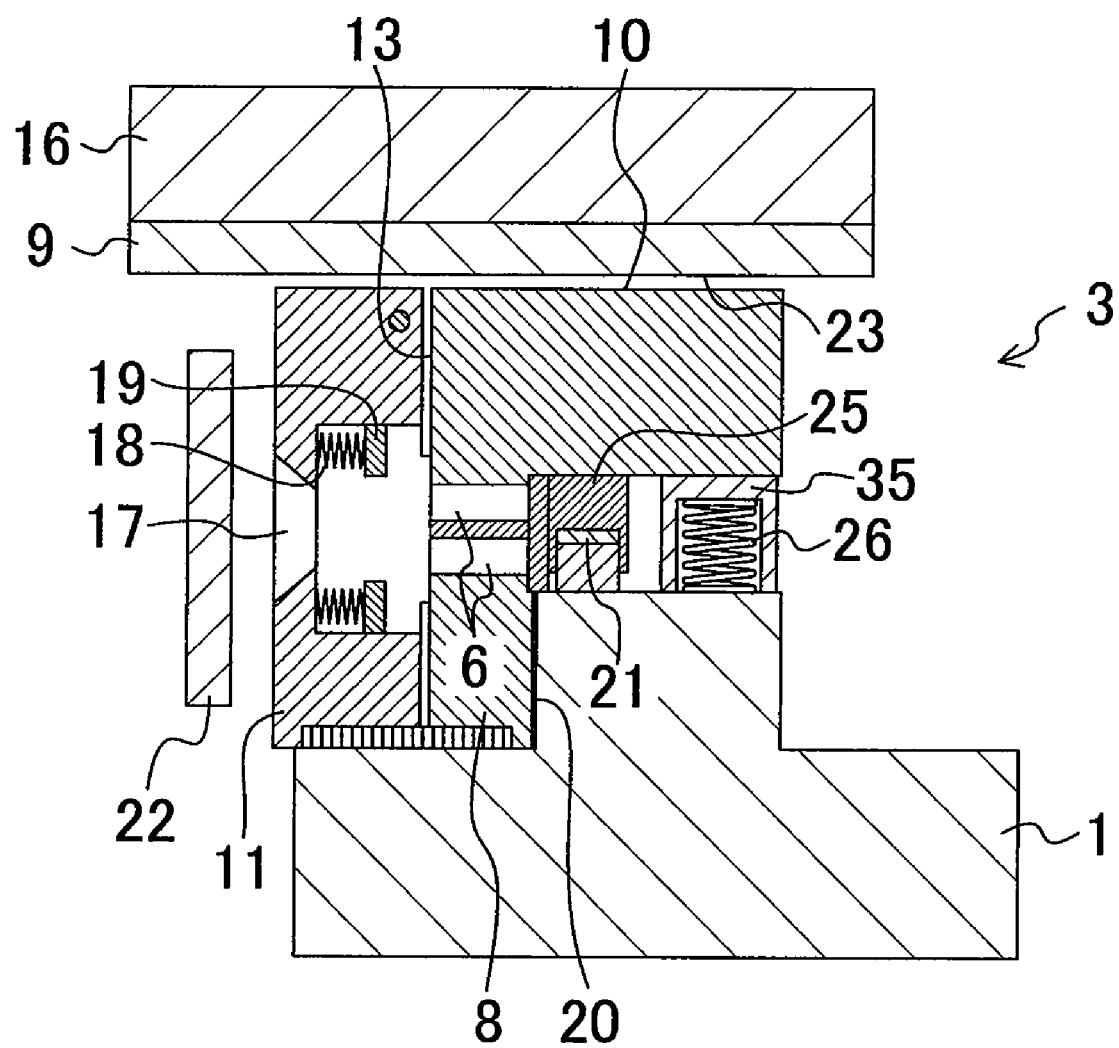
FIG. 2 is a cross-sectional view schematically showing a temperature adjusting member, an electronic component mount member, and a socket of the embodiment.

FIG. 1 is a perspective view schematically showing an electronic component tester according to Embodiment 1. The electronic component tester of FIG. 1 includes sockets 1, a main body 2, a temperature adjusting member 4, a cover 5, and an electronic component mount member 3. FIG. 2 is an enlarged cross-sectional view schematically showing the temperature adjusting member 4, the electronic component mount member 3, and the socket 1.

The socket 1 includes contact members 21 which are configured to electrically come into contact with connection terminals of electronic components. The main body 2 has the plurality of sockets 1 on an upper surface thereof. The electronic component mount member 3 is configured to be set in the socket 1 with the electronic components being mounted on the electronic component mount member 3. The temperature adjusting member 4 includes a Peltier element 16 serving as a heat source, and a heat transferring part 9. The heat transferring part 9 is configured to come into contact with the electronic component mount member 3 on which the electronic components are mounted, thereby transferring heat of the Peltier element 16 to the electronic component mount member 3. On the cover 5, the temperature adjusting member 4 is provided. Moreover, the electronic component tester further includes a temperature control part (not shown) for driving the Peltier element 16, and an electronic component performance test part (not shown) for driving the electronic components via the contact members 21 of the socket 1 and for measuring the operating state of the electronic components. The electronic component tester is a burn-in apparatus for measuring the characteristics of the electronic components while the electronic components are operated in a high temperature environment.

In the electronic component tester of the present embodiment, the connection terminals protruding from the electronic components are inserted into through holes 6 to bring the connection terminals into contact with the contact members 21 to allow a current to flow through the connection terminals, thereby operating the electronic components. In this state, the electronic components are tested at a predetermined temperature.

Embodiment 2

Figure 3:
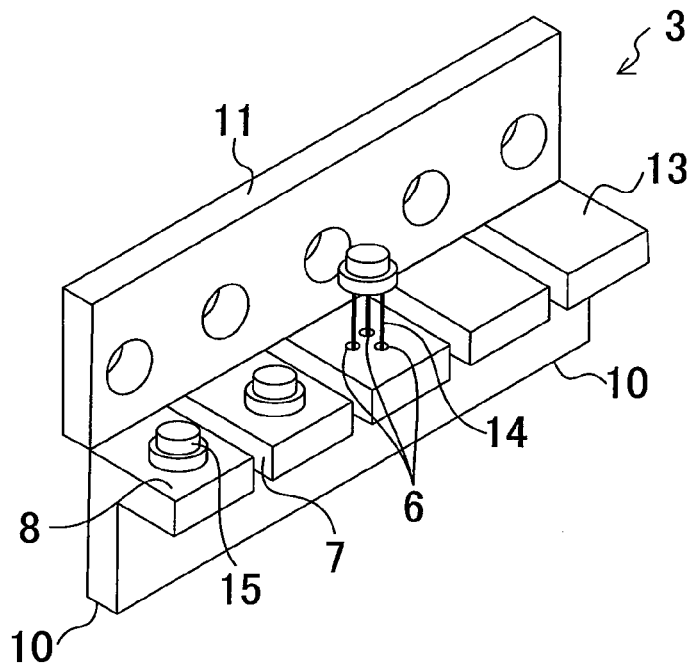
FIG. 3 is a perspective view showing the electronic component mount member in the electronic component tester according to the embodiment.
Figure 4:
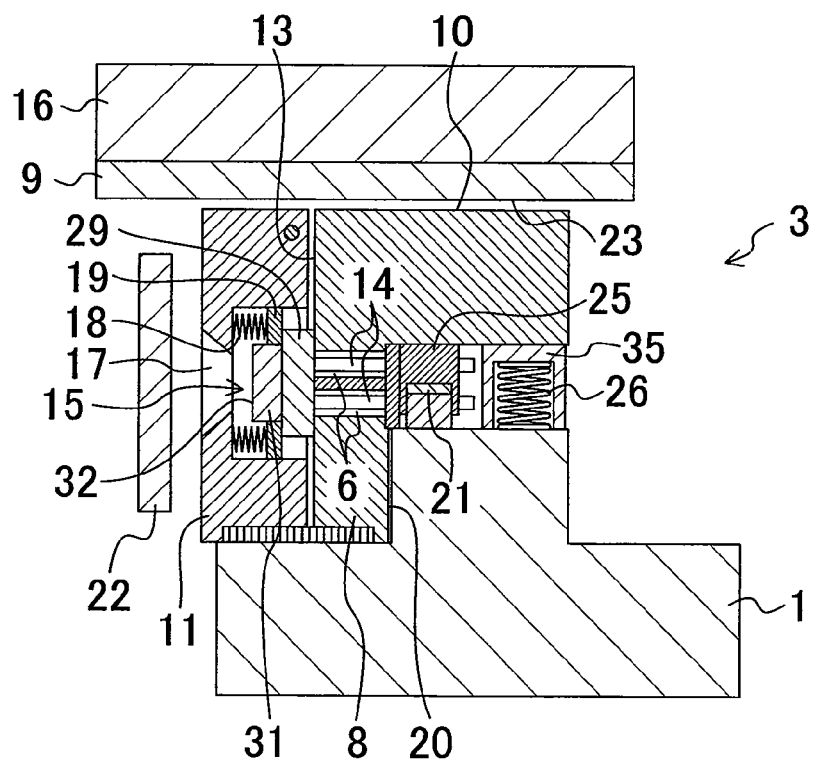
FIG. 4 is a cross-sectional view showing the temperature adjusting member, the electronic component mount member, the socket, and electronic components to be tested according to the embodiment in a contact state.
Figure 5:
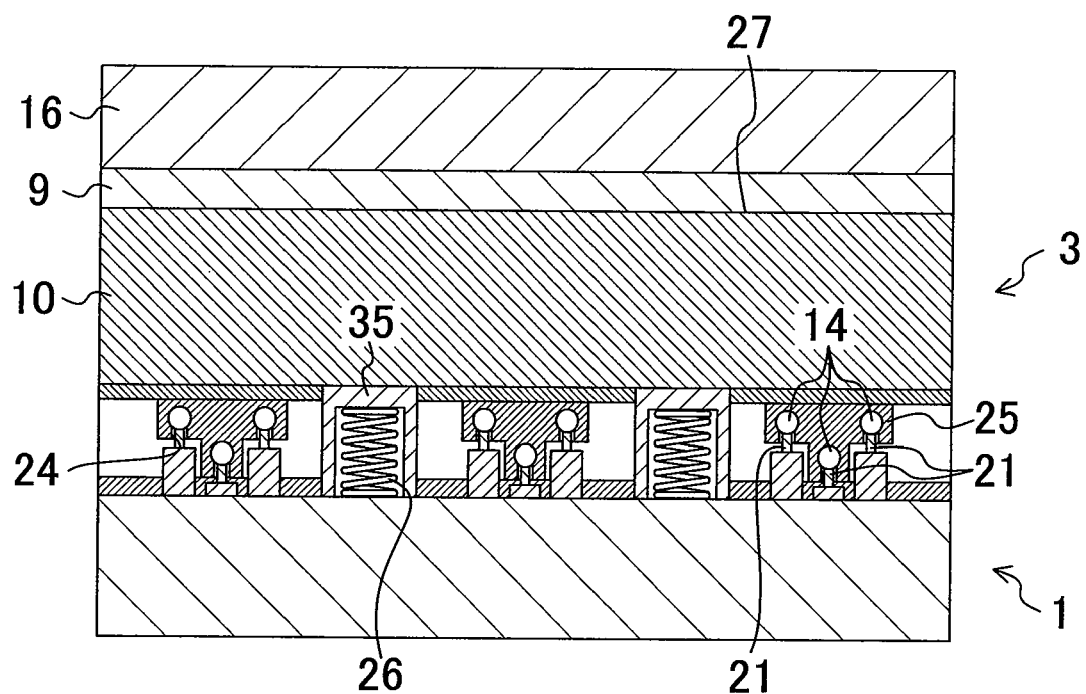
FIG. 5 is a right side view of FIG. 4 showing the temperature adjusting member, the electronic component mount member, the socket, and the electronic components to be tested according to the embodiment in the contact state.

In Embodiment 2, electronic components are tested using the electronic component tester described in Embodiment 1. FIG. 3 is a perspective view schematically showing an electronic component mount member 3 on which semiconductor laser devices 15 serving as electronic components are mounted in the electronic component tester of Embodiment 2. FIG. 4 is a cross-sectional view schematically showing a contact-type temperature adjusting member 4, the electronic component mount member 3, a socket 1, and the electronic components to be tested (e.g., the semiconductor laser devices 15) according to the present embodiment in a contact state. FIG. 5 is a right side view of FIG. 4 schematically showing the contact-type temperature adjusting member 4, the electronic component mount member 3, the socket 1, and the electronic components to be tested according to the present embodiment in the contact state.

The case where the semiconductor laser devices 15 are tested in the present tester will be described below.

First, the structure of a CAN package which is a package form of each semiconductor laser device 15 to be tested will be described.

Figure 6:
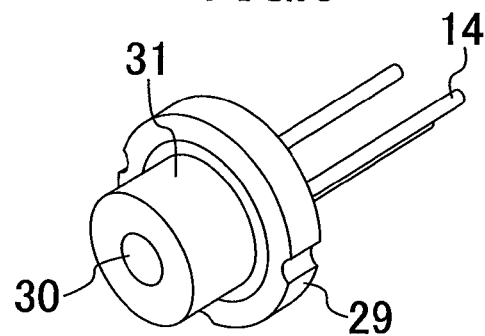
FIG. 6 is a perspective view showing a CAN package.
Figure 7:
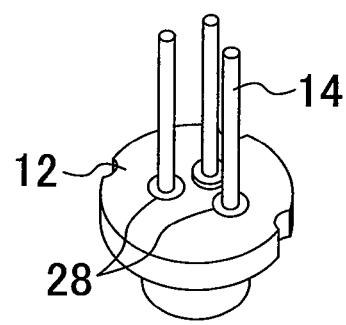
FIG. 7 is a perspective view showing a back surface of the CAN package.

FIG. 6 is a perspective view showing a front surface of the CAN package. FIG. 7 is a perspective view showing a back surface of the CAN package. The CAN package as shown in FIG. 5 used for the semiconductor laser device 15 includes a stem 29 and a cylindrical cap 31 whose opening is sealed with glass 30. The back surface (e.g., a bottom surface) 12 of the CAN package is a temperature adjusting surface of the semiconductor laser device 15 and is also a back surface of the stem 29. A laser is output from a surface where the glass 30 is provided. Three wire-like connection terminals 14 protrude from the back surface 12. Moreover, as shown in FIG. 7, two of the three connection terminals 14 are covered with an insulative resin 28 at their boundaries with the back surface 12. The two connection terminals 14 are not in contact with the stem 29, but are connected to the light emitting element in the cap 31.

As shown in FIG. 3, the electronic component mount member 3 includes a heat transfer plate 8 having grooves 7 separating the individual semiconductor laser devices 15, a third surface 10 which is configured to come into contact with a heat transferring part 9 of the temperature adjusting member 4, and an electronic component cover 11 having the mechanism of pressing the individual semiconductor laser devices 15 against the heat transfer plate 8. The heat transfer plate 8 includes through holes 6 into which the connection terminals 14 are to be inserted.

Each semiconductor laser device 15 is mounted on the electronic component mount member 3 by inserting the connection terminals 14 into the through holes 6 such that the back surface 12 serving as the temperature adjusting surface comes into contact with a first surface 13 of the electronic component mount member 3. Then, the electronic component cover 11 of the electronic component mount member 3 is closed to cover the semiconductor laser devices 15. In this way, the electronic component cover 11 secures and holds the semiconductor laser devices 15, and applies pressure to the semiconductor laser devices 15 such that their temperature adjusting surfaces 12 uniformly come into contact with the first surface 13 of the electronic component mount member 3. The electronic component mount member 3 on which the semiconductor laser devices 15 are thus mounted is set in the sockets 1 of the tester, and the cover 5 of the tester is closed. In this way, the electronic component mount member 3 comes into contact with the temperature adjusting member 4, and the connection terminals 14 of each semiconductor laser device 15 come into contact with the contact members 21 of the socket 1, so that the test can be performed.

Moreover, since the heat transfer plate 8 is provided with the grooves 7, heat generated from the individual semiconductor laser devices 15 during operation is not transferred between the semiconductor laser devices 15 placed next to each other. Therefore, it is possible to control the temperature of the individual semiconductor laser devices 15 with high precision. Specifically, in case of the heat transfer plate 8 without the grooves 7, when a specific semiconductor laser device 15 deteriorates during the test and no longer emits light, the specific semiconductor laser device 15 decreases in heat generation, which also changes the temperature of a semiconductor laser device 15 disposed next to the specific semiconductor laser device 15. The semiconductor laser devices 15 change their characteristics depending on temperature. Therefore, it may be determined that the measured characteristics of the semiconductor laser device 15 disposed next to the specific semiconductor laser device 15 also changed, and thus the semiconductor laser device 15 disposed next to the specific semiconductor laser device 15 may be deemed defective. However, in the present embodiment, since the grooves 7 are provided, there is no possibility that a non-defective device is erroneously deemed defective.

Further details will be described with reference to the cross-sectional view of FIG. 4. FIG. 4 schematically shows the electronic component mount member 3, the Peltier element 16, and the heat transferring part 9 adjacent to the Peltier element 16 in a contact state. The electronic component cover 11 includes first springs (e.g., elastic members) 18 and pressure plates 19 which apply pressure to the semiconductor laser devices 15. The electronic component cover 11 is provided with first openings 17 (openings) through which laser beams emitted from the semiconductor laser devices 15 pass. The electronic component mount member 3 includes the heat transfer plate 8. The heat transfer plate 8 has such a thickness allowing tips of the connection terminals 14 to protrude from a second surface 20 opposite to the first surface 13 when the back surface 12 of each semiconductor laser device 15 is pressed against and comes into contact with the first surface 13. The electronic component mount member 3 includes terminal supporting members 25 made of an insulative resin. When the contact members 21 are laterally brought into contact with the protruding tips of the connection terminals 14, the terminal supporting members 25, together with the contact members 21, nip the tips of the connection terminals 14. The terminal supporting members 25 have second openings 24, into which the contact members 21 are inserted, so that the contact members 21 come into contact with the connection terminals 14. The first surface 13 and the third surface 10 of the electronic component mount member 3 are orthogonal to each other so that the temperature adjusting member 4 does not hinder a light emitting test on the semiconductor laser devices 15. The electronic component tester further includes a light receiving element 22 for receiving laser beams output from the light emitting surfaces 32 of the semiconductor laser devices 15. The socket 1 is provided with second springs 26 to press the electronic component mount member 3 against the heat transferring part 9 and electronic component mount member contact surfaces 35.

Heat generated from the Peltier element 16 is transferred via the heat transferring part 9 to the electronic component mount member 3 in contact with the heat transferring part 9. The heat transfer plate 8 of the electronic component mount member 3 is formed of a metal with excellent thermal conductivity. The heat transferred to a contact surface 23 of the heat transferring part 9 is transferred via the third surface 10 to the heat transfer plate 8, and from the first surface 13 of the electronic component mount member 3 to the semiconductor laser devices 15.

On the heat transferring part 9, a thermocouple (not shown) for measuring temperature is mounted to feedback the measured temperature to a temperature control part (not shown) for controlling the temperature of the Peltier element 16 to achieve a predetermined temperature. Moreover, the second springs 26 and the electronic component mount member contact surfaces 35 provided in the socket 1 apply pressure to the electronic component mount member 3. Thus, the third surface 10 of the electronic component mount member 3 can be uniformly brought into contact with the heat transferring part 9. Therefore, it is possible to transfer heat more efficiently. Furthermore, the area of the third surface 10 located on a plane perpendicular to the first surface 13 is expanded to form the heat transfer plate 8 into an L shape as shown in FIG. 4. This allows a large amount of heat to be transferred to the semiconductor laser devices 15, thereby controlling temperature with quicker response and high precision is made possible.

The connection terminals 14 of the semiconductor laser devices 15 mounted on the electronic component mount member 3 are led out through the through holes 6 formed in the heat transfer plate 8 of the electronic component mount member 3 to the outside, and are positioned and held by the terminal supporting members 25. Positions of the connection terminals 14 are determined by the terminal supporting members 25, the connection terminals 14 are held in the positions by the terminal supporting members 25, and the semiconductor laser devices 15 are pressed and secured by the electronic component cover 11. Therefore, the connection terminals 14 do not come into contact with the heat transfer plate 8. That is, ends of the terminal supporting members 25 close to the through holes protrude from the circumferences of openings of the through holes 6 to the center of the openings. The terminal supporting members 25 are in contact with the connection terminals 14 to keep the positions of the connection terminals 14 such that the connection terminals 14 are out of contact with the heat transfer plate 8.

Moreover, as shown in FIG. 7, since two of the three connection terminals 14 are insulated from the temperature adjusting surface 12 by the insulative resin 28, a current is not allowed to flow between the connection terminals 14. The contact member 21 allows a current to flow through the respective connection terminals 14 to operate the semiconductor laser devices 15. Moreover, as shown in FIG. 5, the terminal supporting members 25 are provided with the second openings 24, which makes it possible to laterally bring the contact members 21 into contact with the connection terminals 14 while holding the connection terminals 14.

As described above, it is possible to evaluate the characteristics of the semiconductor laser device 15. Here, the semiconductor laser device 15 includes: the cap 31 sealing a light emitting element with an inert gas and having a cylindrical, three-dimensional structure like the CAN package; and the three connection terminals 14 led out in a vertical direction on the back surface opposite to the light emitting surface 32 of the light emitting element, where the connection terminals 14 protrude from the temperature adjusting surface 12. The evaluation of the characteristics is performed by bringing the contact members 21 into contact with the connection terminals 14 of the semiconductor laser device 15 to operate the semiconductor laser device 15, bringing the electronic component mount member 3 into contact with the heat transferring part 9 to control the temperature of the semiconductor laser device 15 via the electronic component mount member 3, and measuring a laser beam of the semiconductor laser device 15 by the light receiving element 22.

Other Embodiments

The embodiments described above are intended to provide examples of the present disclosure, but are not intended to limit the present disclosure thereto. For example, an electronic component to be tested may not necessarily be in a CAN-package form. For example, the electronic component to be tested may be in a form of a Transister outline (TO)-type package, an In-line Package, or the like. Moreover, other than semiconductor laser devices, a variety of electronic components such as semiconductor light receiving elements can be tested.

According to an electronic component tester of the present disclosure, an electronic component having connection terminals protruding from a temperature adjusting surface of the electronic component can be tested with temperature being controlled with high precision by directly heating the temperature adjusting surface of the electronic component upon establishing contact with the connection terminals.

The electronic component tester according to the present disclosure can be used in processes for fabricating and testing, for example, semiconductor laser devices used for optical disks.

What is claimed is:

1. An electronic component tester comprising:
   an electronic component mount member on which an electronic component having protruding connection terminals is to be mounted;
   a socket configured to allow a current to flow through the connection terminals of the electronic component; and
   a temperature adjusting member configured to keep the electronic component in a predetermined temperature environment, wherein
   the electronic component mount member includes a heat transfer plate having a first surface which is configured to come into contact with the electronic component, a second surface opposite to the first surface, and a third surface which is configured to come into contact with the temperature adjusting member,
   the heat transfer plate is configured to come into contact with the electronic component at the first surface, and
   the first surface includes through holes of a size permitting insertion of the connection terminals.

2. The electronic component tester of claim 1, wherein the third surface of the heat transfer plate which is configured to come into contact with the temperature adjusting member is perpendicular to the first surface.

3. The electronic component tester of claim 1, wherein
   on the electronic component mount member, multiple ones of the electronic component are mounted, and
   the electronic components located next to each other are separated by a groove formed in the heat transfer plate.

4. The electronic component tester of claim 1, wherein
   the socket includes contact members which are configured to come into contact with the connection terminals to supply power to the connection terminals,
   on the heat transfer plate, a terminal supporting member made of an insulative resin is provided, where the terminal supporting member faces openings of the through holes close to the second surface, the contact members and the terminal supporting member are arranged in a position such that the contact members and the terminal supporting member nip the connection terminals, and the connection terminals come into contact with the terminal supporting member to be kept in a state out of contact with the heat transfer plate.

5. The electronic component tester of claim 1, wherein a thickness of the heat transfer plate is set to a thickness allowing tips of the connection terminals to protrude from the second surface when the connection terminals are inserted through the first surface of the heat transfer plate into the through holes, and a bottom surface of the electronic component comes into contact with the first surface.

6. The electronic component tester of claim 1, wherein the electronic component mount member includes an electronic component cover for securing and holding the electronic component mounted on the electronic component mount member.

7. The electronic component tester of claim 6, wherein the electronic component cover includes an elastic member for pressing the electronic component against the first surface.

8. The electronic component tester of claim 6, wherein the electronic component cover includes an opening through which light output from the electronic component passes.

* * * * *